United States Patent
Desalvo et al.

(10) Patent No.: US 11,746,433 B2
(45) Date of Patent: Sep. 5, 2023

(54) SINGLE STEP ELECTROLYTIC METHOD OF FILLING THROUGH HOLES IN PRINTED CIRCUIT BOARDS AND OTHER SUBSTRATES

(71) Applicant: MacDermid Enthone Inc., Waterbury, CT (US)

(72) Inventors: Donald Desalvo, Suzhou (CN); Ron Blake, Oxford, CT (US); Carmichael Gugliotti, Bristol, CT (US); William J. Decesare, Wolcott, CT (US); Richard Bellemare, Watertown, CT (US)

(73) Assignee: MACDERMID ENTHONE INC., Waterbury, CT (US)

( * ) Notice: Subject to any disclaimer, the term of this patent is extended or adjusted under 35 U.S.C. 154(b) by 748 days.

(21) Appl. No.: 16/674,052

(22) Filed: Nov. 5, 2019

(65) Prior Publication Data
US 2021/0130970 A1  May 6, 2021

(51) Int. Cl.
*C25D 3/38* (2006.01)
*H05K 3/42* (2006.01)
(Continued)

(52) U.S. Cl.
CPC .............. *C25D 3/38* (2013.01); *C25D 5/02* (2013.01); *C25D 5/18* (2013.01); *C25D 7/00* (2013.01);
(Continued)

(58) Field of Classification Search
None
See application file for complete search history.

(56) References Cited

U.S. PATENT DOCUMENTS 5,972,192 A  10/1999  Dubin et al.
6,303,014 B1  10/2001  Taylor et al.
(Continued)

FOREIGN PATENT DOCUMENTS

CN   104694981 A   6/2015
JP   2003183885 A  7/2003
(Continued)

OTHER PUBLICATIONS

Bernards, R. et al., "CVS Control of Via Fill Acid Copper Electroplating Baths" IPC Apex Expo Conference Proceedings, undated.

*Primary Examiner* — Louis J Rufo
(74) *Attorney, Agent, or Firm* — Carmody Torrance Sandak & Hennessey LLP

(57) ABSTRACT

A method of copper electroplating in the manufacture of printed circuit boards. The method is used for filling through-holes and micro-vias with copper. The method includes the steps of: (1) preparing an electronic substrate to receive copper electroplating thereon; (2) forming at least one of one or more through-holes and/or one or more micro-vias in the electronic substrate; and (3) electroplating copper in the at one or more through-holes and/or one or more micro-vias by contacting the electronic substrate with an acid copper electroplating solution. The acid copper plating solution comprises a source of copper ions; sulfuric acid; a source of chloride ions; a brightener; a wetter; and a leveler. The acid copper electroplating solution plates the one or more through-holes and/or the one or more micro-vias until metallization is complete.

23 Claims, 7 Drawing Sheets

(51) Int. Cl.
  *H05K 1/18* (2006.01)
  *H05K 1/02* (2006.01)
  *C25D 5/18* (2006.01)
  *H05K 7/20* (2006.01)
  *C25D 7/00* (2006.01)
  *C25D 5/02* (2006.01)

(52) U.S. Cl.
  CPC ........... *H05K 1/0206* (2013.01); *H05K 1/181* (2013.01); *H05K 3/423* (2013.01); *H05K 3/424* (2013.01); *H05K 7/20154* (2013.01); *H05K 2203/0789* (2013.01); *H05K 2203/1492* (2013.01)

(56) References Cited

U.S. PATENT DOCUMENTS

| | | | |
|---|---|---|---|
| 7,887,693 | B2 | 2/2011 | Nikolova et al. |
| 8,679,316 | B2 | 3/2014 | Brunner et al. |
| 9,611,560 | B2 | 4/2017 | Lu et al. |
| 10,178,754 | B2 | 1/2019 | Kobayashi et al. |
| 10,501,860 | B2 | 12/2019 | Fujiwara et al. |
| 2003/0183526 | A1 | 10/2003 | Kusaka et al. |
| 2003/0221966 | A1* | 12/2003 | Bonkass .................. C25D 5/18 205/150 |
| 2004/0187731 | A1 | 9/2004 | Wang |
| 2008/0023218 | A1 | 1/2008 | Nishu et al. |
| 2008/0314757 | A1 | 12/2008 | Nikolova |
| 2009/0236230 | A1* | 9/2009 | Reents ................... H05K 3/423 205/103 |
| 2010/0126872 | A1 | 5/2010 | Paneccasio, Jr. |
| 2013/0241060 | A1 | 9/2013 | Paneccasio, Jr. |
| 2014/0029324 | A1 | 1/2014 | Sanae et al. |
| 2014/0131863 | A1 | 5/2014 | Hwang |
| 2014/0138252 | A1 | 5/2014 | Dambrowsky et al. |
| 2014/0322912 | A1 | 10/2014 | Paneccasio, Jr. |
| 2015/0159288 | A1 | 6/2015 | Kozhukh et al. |
| 2015/0289387 | A1* | 10/2015 | Mirkovic ............... H05K 3/424 205/103 |
| 2016/0105975 | A1* | 4/2016 | Jayaraju ................ C25D 5/18 205/104 |
| 2018/0010258 | A1* | 1/2018 | Fujiwara ................ C25D 21/12 |
| 2018/0223442 | A1 | 8/2018 | Brunner et al. |
| 2019/0136395 | A1 | 5/2019 | Pokhrel |
| 2020/0010970 | A1 | 1/2020 | Pokhrel |
| 2020/0185224 | A1 | 6/2020 | Kienle et al. |

FOREIGN PATENT DOCUMENTS

| | | |
|---|---|---|
| JP | 2008031516 A | 2/2008 |
| JP | 2018505960 A | 3/2018 |
| TW | 201623359 A | 7/2016 |
| TW | 201918589 | 5/2019 |
| TW | 201920358 A | 6/2019 |
| WO | 2006032346 A1 | 3/2006 |
| WO | 2016/087507 A1 | 6/2016 |
| WO | 2019043146 A1 | 3/2019 |

* cited by examiner

22ASF, 60min. / 100 um hole open

Plating appearance after THF filling process

SINGLE STEP ELECTROLYTIC METHOD OF FILLING THROUGH HOLES IN PRINTED CIRCUIT BOARDS AND OTHER SUBSTRATES

FIELD OF THE INVENTION

The present invention relates generally to a single step electrolytic deposition method for copper, especially for filling through-holes and micro-vias in printed circuit boards and other substrates.

BACKGROUND OF THE INVENTION

Electroplating copper solutions are used in many industrial applications, including anticorrosion and decorative coatings, and in the electronics industry for manufacturing of electronic devices. Aqueous sulfuric acid copper baths are used for the fabrication of printed circuit boards (PCB) and semiconductors. Copper has a better electrical conductivity than most other metals and allows for smaller features application.

Interconnect features are features such as blind micro-vias (BMV), trenches and through-holes that are formed in a dielectronic substrate. These features are metallized, preferably with copper, to render the interconnect electrically conductive. During circuit fabrication, copper is electroplated over select portions of the surface of the printed circuit board, into blind vias and trenches and onto the wall of through-holes passing between the surfaces of the circuit board base material. The walls of the through-holes are metallized to provide conductivity between the circuit layers of the printed circuit boards.

In addition, as electronic devices shrink and get packed closer together on circuit boards, heat management of electronics becomes an issue. Many electronic devices are sensitive to heat, which can make them less efficient and shorten their life. Thus, it is necessary to manage heat dissipation and provide a way to draw heat away from heat-generating components and direct it to other areas of a panel or other substrate for dissipation.

In Circuit board modules and electronic devices, electronic components mounted on the circuit board include surface mounting-type electronic components and insertion mounting-type electronic components. Surface mounting-type electronic component are typically mounted on a board by soldering a terminal to a copper foil provided on a front surface of the circuit board. Insertion mounting-type electronic components are typically mounted on the board by inserting a lead terminal into a penetrating hole provided in the circuit board and soldering the lead terminal.

Electronic components mounted on the circuit board emit heat when current flows through them. In addition, large amounts of heat can be generated in electronic components in which large current flows. When the temperature of the electronic component or the circuit board rises excessively due to heat emitted by the electronic component, there is a concern that an electronic component or an electric circuit formed on the circuit board can malfunction.

Various methods have been developed to manage heat dissipation in electronic devices including, for example, filling through holes with conductive metal-filled epoxy plugging material, inserting copper coins under devices, inserting heat pumps into the circuit boards, the use of conductive adhesives, attachment of heat sinks to the heat generating devices, and electroplating of copper.

U.S. Pat. No. 9,924,589 to Kasashima et al., the subject matter of which is herein incorporated by reference in its entirety, describes a surface mounting-type electronic component mounted on the front surface of the circuit board with a metallic heat transfer body buried in the circuit board so as to overlap the electronic component in a board thickness direction of the circuit board. Heat generated in the electronic component is transferred to a back side of the circuit board by the heat transfer body and the heat is dissipated to the outside. A heat radiation body is provided on the back surface side of the circuit board, and heat generated in the electronic components is transferred to the heat radiation body by the heat transfer body to dissipate heat to the outside.

JP2010-141279 describes forming a penetrating hole in the circuit board and mounting the surface mounting-type electronic component on the front surface of the circuit board to cover the penetrating hole. A projection portion is formed on an upper surface of a heat dissipation body provided on the back surface side of the circuit board and the heat transfer body is provided on the projection portion. The projection portion of the heat dissipation body and heat transfer body are inserted into the penetrating hole from the back surface side of the circuit board so that the heat transfer body is thermally connected to the electronic component. Heat generated in the electronic component can then be transferred to the heat dissipation body by the heat transfer body to dissipate heat to the outside.

In FIG. 4 of JP2010-141279, a plurality of through-holes are formed in the circuit board, and a plurality of penetrating conductors are provided in the circuit board by embedding solder in the plurality of through-holes. The surface mounting-type electronic components are mounted on the surface of the circuit board to thermally connect to the plurality of penetrating conductors. Heat generated in the electronic component is transferred to the heat dissipation body provided below the circuit board by the penetrating transfer body and is dissipated from the heat dissipation body to the outside.

In JP2015-104182, a main body portion of a surface mounting-type electronic component mounted on the back surface of the circuit board is fitted into a recessed portion of a heat sink provided on the back surface side of the circuit board to be thermally connected to the bottom surface of the recessed portion. Heat generated in the electronic component is radiated from the heat sink to the outside.

U.S. Pat. No. 9,345,176 to Sanae et al., the subject matter of which is herein incorporated by reference in its entirety, describes a power supply device that dissipates heat with a small number of parts. An electronic component such as a transformer, a choke coil, or an inductor is mounted so as to penetrate through a rectangular hole formed in the circuit board and the upper surface or the lower surface of the electronic component is brought into thermal contact with a metal frame or a heat dissipation plate so that heat generated in the electronic component is dissipated from the metal frame or the heat radiation plate to the outside.

JP2007-312502 describes mounting an electronic component such as a transformer or a reactor on an upper surface of the circuit board and fitting a core of the electronic component to a heat sink provided on the upper surface side of the circuit board to be thermally connected to the circuit board. Heat generated in the electronic component can then be dissipated from the heat sink to the outside.

JP2015-106956 describes the use of heat dissipating fins to improve heat dissipation. In this instance, the electronic component is installed on the inner bottom surface of a casing, and heat dissipation fins are integrally provided in a lower portion of the casing, and heat generated in the electronic component is dissipated from the heat dissipation fin to the outside. A blowing fan may be installed at the side portion of the casing to blow cooling air at the heat dissipation fins to improve heat dissipation performance.

JP2014-045529 describes an opening for natural air cooling on a side surface of a case that houses a circuit board. A cooling fin and a cooling fan for forced air cooling are provided in a lower portion of the case, so that heat generated in the electronic component mounted on the circuit board can be dissipated.

U.S. Pat. No. 9,445,510 to Reents et al., the subject matter of which is herein incorporated by reference in its entirety describes a galvanic process for filling through-holes of printed circuit boards with copper. The process in Reents is a two-step process in which the workpiece containing through-holes is (i) brought into contact with a metal-deposition electrolyte and a voltage is applied between the workpiece and at least one anode so that deposition occurs preferentially in the center of the through-holes and the through-holes completely or almost completely grow together, and thereafter, (ii) the workpiece is brought into contact with a metal-deposition electrolyte and a voltage is applied between the workpiece and at least one anode so that a current flow is supplied to the workpiece and the through-holes obtained in step (i) which are completely or almost completely divided into halves are filled by the metal up to the desired degree. These steps are illustrated in FIGS. 1 and 2 of Reents et al.

The method of filling through-holes with copper, as described in Reents et al. is a viable method of drawing heat from a device that is mounted onto the through hole and transferring it other levels of the panel. However, it would be desirable to develop a process for filling through-holes and/or micro-vias, such as for heat dissipation, that can be integrated into the printed circuit board manufacturing process in a more efficient manner.

SUMMARY OF THE INVENTION

It is an object of the present invention to provide an improved method of dissipating heat from an electronic device.

It is another object of the present invention to provide a method of dissipating heat in an electronic device that can be incorporated in or that is already a part of the printed circuit board (PCB) manufacturing process that is able to fill a through hole and that eliminates the need for other processes such as plugging and sanding, copper coining, and other similar processes.

It is another object of the present invention to provide a process that provides higher thermal conductivity than conductive plugs and adhesives.

It is still another object of the present invention to provide a process that gains the benefit of electrical conductivity.

It is still another object of the present invention to provide a reliable method of metallizing through-holes with high aspect ratios and without any voids or defects.

It is still another object of the present invention to provide an improved method of dissipating heat in a circuit board by metallizing through holes with copper and in which the resulting solid copper structures, when locating beneath heat generating devices, are capable of providing an effective means of transporting heat or thermal energy from these devices to areas of the circuit board, panel, or other electronic substrate, where it can be harmlessly dissipated It is still another object of the present invention to provide a one-step process for filling copper through holes in a copper plating bath, which shortens the number of tanks in a line, reducing equipment costs, reducing the number of tanks to analyze and maintain, and reduces the number of rectifiers required for plating.

It is still another object of the present invention to eliminate potential separation issues between the via fill plating and bridge plating realized by other processes.

The present invention provides a method for electrolytically filling through holes in electronic substrates, such as printed circuit boards or printed wiring boards, with copper in as single-step, single solution plating process. The method described herein provides circuit designers with a method for heat management of electronic systems where higher packing of higher power heat generating devices is needed. The resulting solid copper structures, when located beneath heat generating devices, provide an effective means of transporting heat energy from these devices to other areas of the panel where it can be harmlessly dissipated. The result is devices that operate more efficiently and that exhibit a longer life.

To that end, in one embodiment, the present invention relates generally to method of copper electroplating in the manufacture of printed circuit boards, the method comprising the steps of:
a) preparing an electronic substrate to receive copper electroplating thereon;
b) forming at least one of one or more through-holes and/or one or more micro-vias in the electronic substrate; and
c) electroplating copper in the at one or more through-holes and/or one or more micro-vias by contacting the electronic substrate with an acid copper electroplating solution comprising:
 a. a source of copper ions;
 b. sulfuric acid;
 c. a source of chloride ions;
 d. a brightener;
 e. a wetter; and
 f. a leveler;
  wherein the acid copper electroplating solution is configured for a single-step process, wherein the same acid copper electroplating solution plates the one or more through-holes and/or the one or more micro-vias until metallization is complete.

DETAILED DESCRIPTION OF THE PREFERRED EMBODIMENTS

Figure 1:
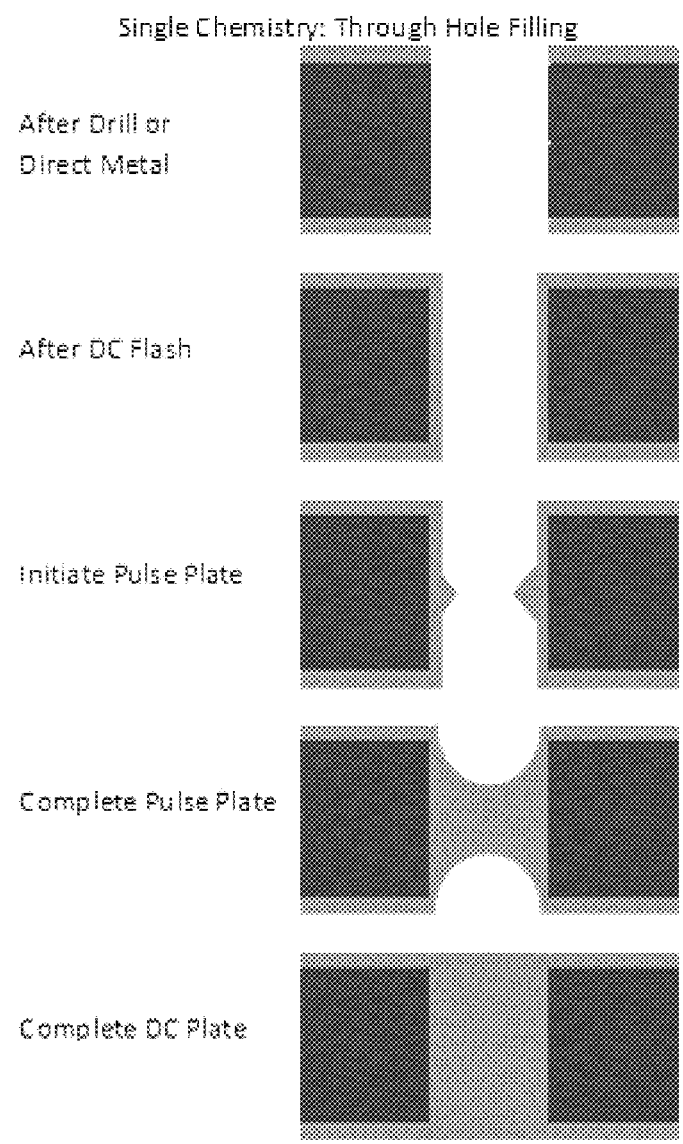
FIG. 1 depicts the steps of the single chemistry through-hole plating of copper in accordance with the present invention.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +1-15% or less, preferably variations of +1-10% or less, more preferably variations of +1-5% or less, even more preferably variations of +1-1% or less, and still more preferably variations of +1-0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper" and the like, are used for ease of description to describe one element or feature's relationship to another element(s) or feature(s) as illustrated in the figures. It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As used herein the term "substantially-free" or "essentially-free" if not otherwise defined herein for a particular element or compound means that a given element or compound is not detectable by ordinary analytical means that are well known to those skilled in the art of metal plating for bath analysis. Such methods typically include atomic absorption spectrometry, titration, UV-Vis analysis, secondary ion mass spectrometry, and other commonly available analytically methods.

As used herein, the term "dimple" refers to a depression in the bridge or conformal copper plating layer over the filled through-holes and/or micro-vias.

One of the benefits of the invention described herein is that plating, especially copper plating, is already a part of the PCB manufacturing process, so being able to use copper plating to fill a through-hole eliminates the need for other processes such as plugging and sanding, copper coining, etc.

Furthermore, the use of pure copper provides a much higher thermal conductivity than conductive plugs and adhesives. Thus, there is an added benefit of electrical conductivity, if it is needed.

Finally, the process of the present invention allows for the complete filling of through-holes in a single-step in a single copper plating bath, shortening the number of tanks in a line and thus equipment costs, and reducing the number of tanks to maintain, and the number of rectifiers needed for plating. In addition, the process of the present invention also eliminates potential separation issues between via fill plating and bridge plating offered in other processes.

The general steps of the process of the instant invention to manufacture a printed circuit board that provides improved heat dissipation include the following:

The initial step is to provide the PCB with various drilled through-hole arrays for thermal management. Thus, the printed circuit board comprises a metallized panel with an array or arrangement of drilled through-holes. Through-holes, micro vias, and such can be formed by various methods, including, for example, mechanical drilling, laser drilling, plasma etching, single or double shot and spark erosion.

Next, the through-holes are made conductive using a metallization technique as is generally known in the art. Various metallization techniques may be used including, for example, sputter coating, electroless copper, carbon-based direct metallization, graphite-based direct metallization, conductive polymers, palladium-based direct metallization, among others. Other metallization techniques would be known to those skilled in the art and would be usable in the process of the present invention. The primary metallization layer may be electroless copper, electrolytic copper flashing, or a direct metallization layer formed by carbon, graphite, or conductive polymer-based direct metallization.

The panel plate surface is preferably a copper or copper-coated substrate.

Next, the metallized panels are cleaned and activated using conventional pretreatment techniques such as acid or alkaline cleaning and acid dip or microetching with rinsing in between steps.

In one embodiment, a conductive seed layer, such as by electroless deposition of copper, is formed on the non-conductive surface and is required to initiate the electroplating of copper. The seed metal layer is electrically conductive, provides adhesion and permits the exposed portions of its upper surface to be electroplated.

Thereafter, the panels are contacted with the acid copper plating bath of the invention comprising a source of copper ions, sulfuric acid, halide ions, and specialized organic additives comprising wetters, brighteners, and levelers. The acid copper plating bath of the invention, in combination with a specialized rectification procedure, is capable of filling through-holes in the panel in a highly effective one-solution, one step process. In contrast, prior art copper electroplating processes for plating through-holes can require a two-step process, including a first copper plating solution and plating conditions to close a hole and a second copper plating solution and plating conditions to fill the two vias thus formed.

In one embodiment, the plating cycle comprises (a) pulse plating for a first time period, wherein the pulse plating uses two pulse forms on opposite sides of the electronic substrate, wherein the pulse forms exhibit a phase shift; and then (b) direct current plating using forward current for a second time period.

The source of copper ions in the acid copper plating bath is preferably copper sulfate. The resistivity of the copper plating solution is greater when the concentration is increased. The solubility of copper sulfate decreases when the sulfuric acid concentration is increased. The concentration of copper sulfate in the acid copper plating bath is typically maintained within the range of about 100 to about 300 g/L, more preferably about 180 of about 280 g/L, most preferably in the range of about 200 to about 250 g/L.

The principle function of sulfuric acid is to provide for maximum solution conductivity. Due to the high conductivity of the solution, the anode and cathode polarizations are small as is the voltage required for depositing copper. In addition, when very high cathode current densities are used, a higher concentration of copper sulfate is required within the recommended limits. Changes in sulfuric acid concentration have more influence than changes in copper sulfate concentration on anode and cathode polarization and on solution conductivity. The concentration of sulfuric acid in the acid copper plating bath is typically maintained within the range of about 10 to about 150 g/L, more preferably about 70 to about 100 g/L.

The acid copper plating bath also contains halide ions, most preferably chloride ions. Chloride ions enhance the adsorption and inhibition of the wetter. A small amount of chloride ions acts as binding sites for the polyglycols to the electrode surface. Chloride made be added in the form of sodium chloride or as diluted hydrochloric acid. Chloride ions in the acid copper plating bath act to eliminate striated deposits in high current density areas. Chloride ions also affect the surface appearance, structure, micro-hardness, crystallographic orientation and internal stress of the deposits. Chloride ions are consumed by electrochemical/chemical changes during electrolysis, partial inclusion into the deposit, dragout loss, bath dilution, and anode maintenance. The concentration of chloride ions in the acid copper electroplating bath is typically maintained within the range of about 20 to about 200 ppm, more preferably about 60 to about 150 ppm, most preferably within the range of about 70 to about 100 ppm.

The characteristics of copper deposits are influenced by concentration of copper sulfate, free acid, additives, temperature, cathode current density and the nature and degree of agitation.

Fill-in behavior in the through-hole is influenced at least in part by controlling the deposition kinetics within the through-holes and on the horizontal portions and edges. This may be achieved by introducing certain organic additives into the acid copper electroplating bath to influence the rate of copper ions that deposit on the respective locations. As discussed above, the organic additives include one or more of brighteners, wetters, and levelers.

The brightener incorporates organic compounds that contain sulfur and other functional groups and is responsible for the formation of small grain refinement deposit. The brightener also acts as a leveling agent. The brightener is consumed by incorporation into the electrolytic deposit at the cathode or by oxidation onto the surface of the anode, especially if insoluble anodes are used. The brightener can also be consumed by de-coupling in the presence of metallic copper, generating by-products, or by air oxidation, anode maintenance or by dragout loss/bath dilution.

Examples of suitable brighteners include one or more of 3-(benzothiazolyl-2-thio)-propyl sulfonic acid, sodium salt; 3-mercaptopropane-1-sulfonic acid, sodium salt; ethylene dithiodipropyl sulfonic acid, sodium salt; bis-(p-sulfophenyl)-disulfide, disodium salt; bis-(ω-sulfobutyl)-disulfide, disodium salt; bis-(ω-sulfohydroxypropyl)-disulfide, disodium salt; bis-(ω-sulfopropyl)-disulfide, disodium salt; bis-(ω-sulfopropyl)-sulfide, disodium salt; methyl-(ω-sulfopropyl)-disulfide, disodium salt; methyl-(ω-sulfopropyl)-trisulfide, disodium salt; O-ethyldithio-carbonic acid-S-(ω-sulfopropyl)-ester, potassium salt; thioglycolic acid; thiophosphoric acid-O-ethyl-bis-(ω-sulfopropyl)-ester, disodium salt; and thiophosphoric acid-(ω-sulfopropyl)-ester, trisodium salt. Other suitable sulfur-containing compounds and salts thereof would also be known to those skilled in the art and would be usable in the acid copper electroplating bath described herein. In a preferred embodiment, the brightener comprises bis-(ω-sulfopropyl)-sulfide or 3-mercaptopropane-1-sulfonic acid or a salt thereof.

The concentration of the brightener in the acid copper plating bath is typically maintained in the range of about 0.1 to about 30 ppm, more preferably about 0.5 to about 20 ppm, most preferably within the range of about 4-10 ppm.

The wetter comprises a high molecular weight organic compound, such as a polyglycol, having low solubility in the solution and a low coefficient of diffusion. The suppressor agent is adsorbed on the cathode surface, uniformly forming a diffusion layer that limits the transfer of brightener and leveler. In the presence of chloride ions, the degree of adsorption and inhibition is further enhanced. In one embodiment, the molecular weight of the wetter is at least about 300. More preferably, the molecular weight of the wetter is between about 500 and about 5,000.

The wetter may be consumed during electrolysis, in which reduction of molecular weight occurs, or may be consumed by partial including into the deposit. In addition, a black film may be formed on the anodes, which is laden with solution containing wetter. As with the brightener, the wetter may be consumed by anode maintenance or by dragout loss/bath dilution.

Examples of suitable wetters include one or more of carboxymethylcellulose, nonylphenolpolyglycolether, octandiol-bis-(polyalkylene glycol ether), octanol polyalkylene glycol ether, oleic acid polyglycol ester, polyethylene glycol polypropylene glycol copolymerisate, polyethylene glycol, polyethylene glycol dimethylether, polypropylene glycol, polyvinylalcohol, β-naphthyl polyglycol ether, stearic acid polyglycol ester, stearic acid alcohol polyglycolether, and copolymers of propylene glycol and ethylene glycol. Other suitable polyglycols and similar compounds would also be known to those skilled in the art and would be usable as the wetter in the acid copper electroplating bath of the invention. In one preferred embodiment, the wetter comprises copolymers of propylene glycol and ethylene glycol.

The concentration of the wetter in the acid copper plating bath is typically maintained in the range of about 0.1 to about 50 g/L, more preferably about 1 to about 10 g/L.

The leveler is typically a medium molecular weight organic compound containing key functional groups. In one embodiment, the leveler has a molecular weight of between about 300 and about 10,000, more preferably between about 500 and about 5,000. The leveler has low solubility in the solution and a low coefficient of diffusion and acts through selective adsorption on a readily accessible surface (i.e. flat surface and protruding high points). True leveling is a result of diffusion control of the leveling species. The leveler is consumed by electrochemical/chemical changes during the electrolysis, by partial inclusion in the deposit, by anode maintenance, and by dragout loss/bath dilution.

Examples of suitable levelers include polyamines, ethoxylated polyamines, polypyridine, polyimidazole, polyvinyl pyridine, polyvinyl imidazole, ethoxylated polyvinyl pyridine, and ethoxylated polyvinyl imidazole. In one preferred embodiment, the leveler comprises ethoxylated polyamines and/or polyvinyl pyridine.

The concentration of the leveler in the acid copper plating bath is typically maintained in the range of about 0.001 to about 200 ppm, more preferably about 0.001 to about 100 ppm, most preferably about 0.001 to about 50 ppm.

Table 1 summarizes the ingredients of the copper plating bath in accordance with the present invention:

TABLE 1

Typical Ingredients and Concentrations of Copper Plating Bath

| Ingredient | Concentration Range |
| --- | --- |
| Copper sulfate | 100-300 g/L |
| Sulfuric acid | 10-150 g/L |
| Chloride ions | 40-200 ppm |
| Brightener | 4-10 ppm |
| Wetter | 1-10 g/L |
| Leveler | 0.001-50 ppm |

The substrate is contacted with the aqueous acid copper plating bath solution by various means known in the art including, for example, immersion of the substrate into the bath or use of other plating equipment. By using specialized pulse rectification, pulse wave forms are initially used that result in accelerated filling of the middle of the through-holes while minimizing the amount of surface copper plated. As the center of the through-hole closes, the wave form is transitioned to straight DC current in the same acid copper plating solution. The result is a continuous plating of the through-hole until it is completely filled.

The aqueous acidic copper plating bath can be used in conventional vertical or horizontal plating equipment. The plating system can be designed as a vertical hoist, VCP, or horizontal system with inert or soluble anodes.

Examples of suitable anode materials include iridium oxide coating on titanium mesh or mixed metal oxide coated anodes. Other suitable anode materials would also be known to those skilled in the art. The anode is also optionally, but preferably, shielded to optimize macro distribution.

In one embodiment, the anode material is iridium oxide/tantalum oxide coated titanium. One suitable anode is available from De Nora S.p.A under the tradename De Nora DT. Other suitable anode materials would be known to those skilled in the art and are also usable in the practice of the present invention.

The substrate or at least a portion of its surface may be contacted with the aqueous acid coper plating solution by various methods, including spraying, wiping, dipping, immersing, or by other suitable means.

Preferably, the aqueous copper plating solution is agitated during the plating process. Agitation may be accomplished, for example, by mechanical movement of the bath such as by shaking, stirring, or continuous pumping of the plating bath solution, or by ultrasonic treatment, elevated temperature, or gas feeds, such as purging with air on an inert gas (i.e., argon or nitrogen).

The process described herein also preferably includes cleaning, etching, reducing, rinsing and/or drying steps as is generally known in the art.

The acid copper electroplating bath described herein is equipped with a solution manifold system comprising an array of nozzles for providing direct solution impingement against the panel. Nozzles on either side of the panel are directly aligned with each other and, with the pumps, are capable of solution flows of 0 to 3.0 L/min/nozzle.

Plating can be done in panel, pattern, or button plating mode as is generally known to those skilled in the art.

After plating, the panels can be used as is or the panels can be run through typical processes such as planarization or copper reduction or further layers can be built up where additional micro-vias may be stacked on the copper filled through-holes.

FIG. 1 depicts the steps of the single chemistry through-hole plating of copper in accordance with the present invention.

As set forth in FIG. 1, through-holes are drilled or otherwise formed in the circuit board. A primary metallization step such as electroless copper or direct metallization is performed after drilling to render the laminate surface within the through-hole and/or micro-via conductive. Optionally, the primary metallization layer may be flash plated with a thin layer of copper to increase conductivity and increase robustness. Next, pulse plating is initiated to accelerate filling of the middle of the through-holes while minimizing the amount of surface copper plating. Next, as pulse plating is completed, the center of the through-hole closes. Finally, the wave form is transitioned to DC current in the same acid copper plating solution to plate the through-hole until it is completely metallized.

The process described herein is used for metallizing a substrate having a thickness of between 0.005 and about 3 mm, more preferably between about 0.01 and about 1.0 mm, most preferably between about 0.05 to about 0.5 mm. Through-hole diameters generally range from about 0.005 and about 1 mm, preferably about 0.01 to about 0.8 mm, most preferably about 0.075 to about 0.25 mm. Thus, the process described herein is suitable for metallizing through-holes having an aspect ratio of between about 0.5:1 and about 6:1, more preferably between about 0.5:1 and about 4:1, most preferably between about 0.5:1 and about 3:1.

The electrolytic plating of through-holes described herein combines pulse plating and direct current plating in a prescribed manner to achieve complete filling of the through-holes in a single-step, single bath plating process.

Table 2 depicts the process parameters for direct current and pulse plating current in accordance with the present invention.

TABLE 2

Process Parameters for Direct Current and Pulse Plating

| Type of current | Parameter | Ranges |
| --- | --- | --- |
| Direct Current | Forward current | 0.5 to 5.0 ASD |
| Pulse Plating | Forward current | 0.5 to 5.0 ASD |
| | Single or multi-step | 50% to 300% forward current |
| | Reverse current | Up to 4× forward current density |
| | Phase shift | 10 to 280 degrees |
| | Frequency | 0.5 to 5.0 Hz |
| | Forward/reverse time ratio | 5:1 to 9:1 |
| | Forward time | Up to 760 milliseconds |
| | Reverse time | Up to 120 milliseconds |
| | Dead time | Up to 120 milliseconds |

Table 3 describes an example of the steps in the process of the invention, including current density and cycle times that have been determined to produce a good result. It is noted that Step 1 is an optional step in the process and the present invention can be performed with only Steps 2 and 3.

TABLE 3

Steps in plating process

| Step Number | Current Mode | Current Density (ASD) | Cycle time (min) |
|---|---|---|---|
| 1 | Direct Current | 2.5 | 5 |
| 2 | Pulse Current | 2.5 | 45 |
| 3 | Direct Current | 2.0 | 30 |

Table 4 below sets forth an example of a pulse plating cycle in accordance with the present invention. As set forth in Table 4, the plating cycle may be different on opposite sides of the PCB being processed.

TABLE 4

Pulse plating cycle.

| (4 ASD) | Step 1 | Step 2 | Step 3 | Step 4 | Step 5 | Step 6 | Step 7 | Step 8 |
|---|---|---|---|---|---|---|---|---|
| Side 1 (Amps) | 2 | 4 | 2 | −12 | 2 | 8 | 2 | 0 |
| Side 2 (Amps) | 2 | 0 | 2 | 8 | 2 | −12 | 2 | 4 |
| Time (ms) | 120 | 120 | 140 | 120 | 120 | 120 | 140 | 120 |

As described herein, the process of the present invention uses a special type of metallization by means of a pulse reverse current. This special technique is characterized by a 10-280° phase shift between the two pulse forms which are generated by two separate pulse rectifiers. By means of the two rectifiers the two sides of a printed circuit board can be individually metallized. A further characteristic consists in the use of a periodically repeating pulse pause for both rectifiers.

The ratio of the duration of the at least one forward current pulse to the duration of the at least one reverse current pulse is adjusted to at least 4:1, more preferably 4:1 to 10:1, more preferably 5:1 to 9:1.

The duration of the at least one forward current pulse can be adjusted to preferably at least 5 ms to 250 ms, more preferably 100 to 150 ms.

The duration of the at least one reverse current pulse is preferably adjusted to 5 to 250 ms, more preferably 100 to 150 ms.

In one embodiment, duration of the forward current pulse and the duration of the reverse current pulse are the same or substantially the same.

The peak current density of the at least one forward current pulse at the work-piece is preferably adjusted to 15 A/dm$^2$ at most. Particularly preferable is a peak current density of the at least one forward current pulse at the workpiece of about 5 A/dm$^2$.

The peak current density of the at least one reverse current pulse at the work piece will preferably be adjusted to a value of no more than 60 A/dm$^2$. Particularly preferred is a peak current density of the at least one reverse current pulse at the workpiece of about 20 A/dm$^2$.

In the further progress of the metallization process at least one parameter of the pulse reverse current can be varied, wherein this parameter is chosen from a group comprising the ratio of the duration of the forward current pulse to the duration of the reverse current pulse and the ratio of the peak current density of the forward current pulse to the peak current density of the reverse current pulse. It has been proven to be particularly advantageous to increase the ratio of the peak current density of the forward current pulse to the peak current density of the reverse current pulse when metallizing the workpiece and/or to decrease the ratio of the duration of the forward current pulse to the duration of the reverse current pulse.

In one embodiment, the apparatus used in the practice of the present invention includes:

A) a plating tank in which the acid copper electroplating bath is maintained;

B) a solution delivery system comprising a dual box manifold or a vertical pipe manifold;

C) an array of educator nozzles or cone nozzles arranged to simultaneously impinge both sides of a circuit board immersed in the plating tank;

D) a plating rack for securing the PCBs; and

E) an electroplating power supply rectifier capable of direct current and pulse reverse plating.

In one embodiment, the apparatus may comprise standard vertical hoist or automatic plating equipment. In another embodiment, the apparatus may comprise horizontal plating equipment. However, vertical plating equipment is preferred.

The plating tank preferably comprises a temperature controller to regulate heating and cooling, which is connected to a heating and cooling system that is capable of maintaining the acid copper electroplating bath at the desirable bath temperature+/−1.5° C. In a preferred embodiment, the plating bath is maintained at a temperature of between about 10 and about 50° C., more preferably between about 20 and about 30° C., most preferably at a temperature of between about 22 and about 25° C.

The acid copper electroplating bath is optionally, but preferably agitated. In one embodiment, agitation is conducted by use of an adjustable speed cathode rail agitation that extends up to 12 to 15 cm side to side distance. A clean air agitation sparge dual pipe may be aligned underneath the cathode. Other means of agitation would also be known to those skilled in the art and are usable in the present invention.

The anode to cathode ratio is preferably targeted at greater than 1:0.75 to 1:1. What is important is to have enough surface area to even the current distribution across the entire PCB.

The plating tank is also preferably equipped with an automatic copper oxide replenishment system to maintain the concentration of copper sulfate to within a desired level. In addition, the apparatus also preferably includes a copper oxide mixing tank and a copper oxide feeder for introducing copper oxide into the replenishment system. The plating tank also includes means for replenishing other ingredients of the acid copper plating bath and for monitoring the concentration of the ingredients.

The electroplating racks may be coated stainless steel, or may be partially or non-coated plating racks. Optionally, the electroplating racks may comprise a coated copper core.

The copper electroplating tank is also preferably outfitted with a continuous solution filtration system that is capable of filtering particle of about 1 micron or more and that is designed to handle at least 3 solution turnovers per hour, preferably at least 4 solution turnovers per hour and more preferably at least 5 solution turnovers per hour.

The apparatus also preferably includes a controller capable of managing heating, cooling, and chemical additions with the plating tank.

Finally, it is also highly desirable that the copper electroplating apparatus be outfitted with a ventilation system as would generally be known to those skilled in the art.

The electroplating power supply rectifier is configured to handle both direct current and pulse reverse current. The rectifier may be water or air cooled. The rectifier is programmable with a multistep capability. In one embodiment, the rectifier is programmable with multiple steps, including at least 4 steps or least 6 steps. In one preferred embodiment, the rectifier is programmable with 8 steps.

The rectifier is also capable of dual current output side to side rectification. In addition, the rectifier may be configured for asynchronous pulse cycles with a phase shift of 0 to 180 degrees. Preferably, in direct current mode, ripples is less than 5% at 100% output.

The box manifold/vertical pipes are designed to include the array of eductor nozzles or cone nozzles. Opposing nozzles are designed front to back side. The nozzles are preferably arranged in a staggered pattern and may be arranged about 2 to about 8 cm apart, more preferably about 3 to about 6 cm apart, most preferably about 4 to about 5 cm apart in both horizontal and vertical direction.

The invention is further explained by means of the following examples:

EXAMPLES

An acid copper plating bath was made up according to the following parameters:

| Ingredient | Make Up | Control Range |
| --- | --- | --- |
| Copper sulfate | 240 g/L | 230-245 g/L |
| Sulfuric acid | 90 g/L | 85-90 g/L |
| Chloride ions | 75 ppm | 70-100 ppm |
| Brightener | 7 ppm | 4-10 ppm |
| Wetter | 5 g/L | 1-10 g/L |
| Leveler | 10 ppm | 0.001-50 ppm |
| Bath Temperature | 23° C. | 22-25° C. |

The concentration of copper sulfate was maintained with the addition of copper oxide, on either a manual or automatic basis, based on Amp hours of operation and/or with chemical titration analysis.

The concentration of sulfuric acid and chloride ions was replenished based on chemical titration analysis.

Replenishment of the brightener, wetter, and leveler was accomplished with an automatic dosing system, based on Amp hours of operation and/or cyclic voltammetric stripping (CVS) analysis.

Comparative Example 1

The acid copper plating bath described above was used to plate a test panel using a standard DC filling process.

A 85 minute cycle time was used to plate the test panel having a thickness of 0.075 mm and 0.12 mm laser-drilled through-holes.

The current density was 3 A/dm$^2$ and plating was performed for 85 minutes.

Figure 2:
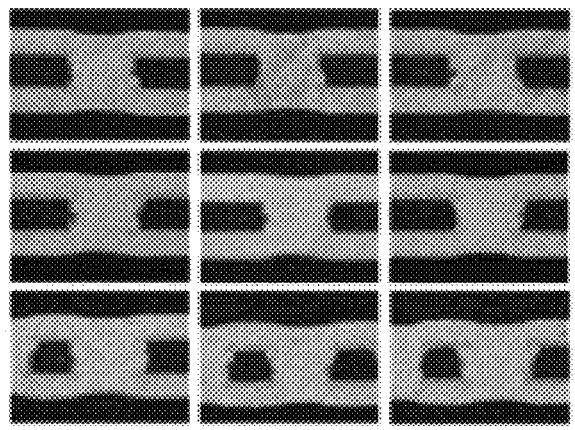
FIG. 2 depicts a cross-sectional view of through-holes of a plated test panel in accordance with Comparative Example 1.

FIG. 2 depicts a cross-section of the plated circuit board and shows a plating deposit of 28-40 microns and exhibiting a dimple of 6-12 microns.

Example 1

The acid copper plating bath described above was used to plate a test panel using a plating cycle in accordance with the present invention and the plating parameter outlined in Table 4.

An 80 minute cycle time was used to plate the test panel having a thickness of 0.075 mm and 0.12 mm laser drilled through-holes.

The current density was 2.2 A/dm$^2$ and plating was performed for 80 minutes.

Figure 3:
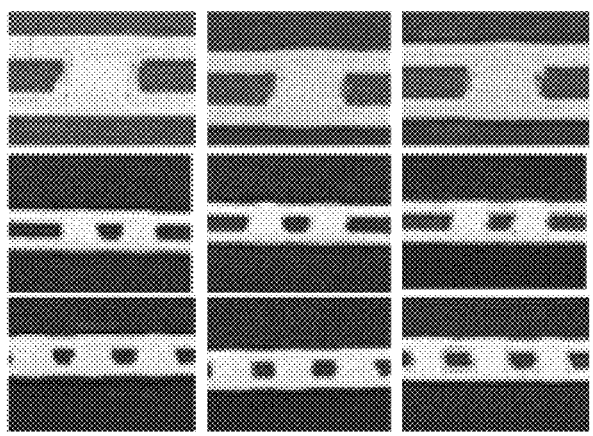
FIG. 3 depicts a cross-sectional view of through-holes of a plated test panel in accordance with Example 1.

FIG. 3 depicts a cross-section of the plated circuit board and shows a plating deposit of 23-25 microns and no dimple.

Comparative Example 2

The acid copper plating bath described above was used to plate a test panel using a standard DC filling process.

A 70 minute cycle time was used to plate the test panel having a thickness of 0.07 mm and 0.1 mm through-holes therein and in which the through-holes were formed using mechanical means.

The current density was 3 A/dm$^2$ and plating was performed for 70 minutes.

Figure 4:
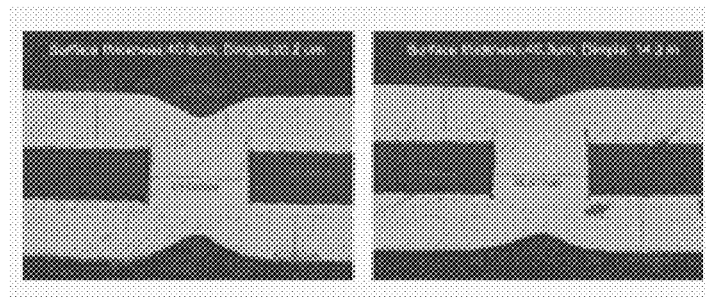
FIG. 4 depicts a cross-sectional view of through-holes of a plated test panel in accordance with Comparative Example 2.

FIG. 4 depicts a cross-section of the plated circuit board and shows a plating deposit of 40 microns and exhibiting a dimple of 20 microns.

Example 2

The acid copper plating bath described above was used to plate a test panel using a plating cycle in accordance with the present invention and the plating parameter outlined in Table 4.

A 60 minute cycle time was used to plate the test panel having a thickness of 0.07 mm and 0.1 mm through-holes therein and in which the through-holes were formed using mechanical means.

The current density was 2.2 A/dm$^2$ and plating was performed for 60 minutes.

Figure 5:
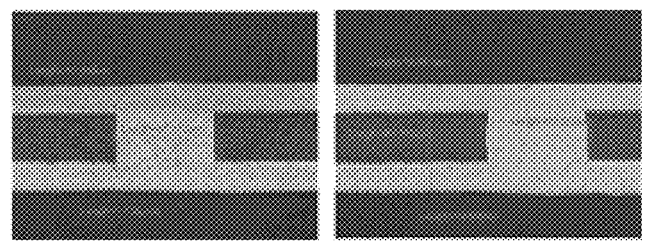
FIG. 5 depicts a cross-sectional view of through-holes of a plated test panel in accordance with Example 2.

FIG. 5 depicts a cross-section of the plated circuit board and shows a plating deposit of 18-20 microns and no dimple.

Example 3

The acid copper plating bath described above was used to plate a test panel using a plating cycle in accordance with the present invention and the plating parameter outlined in Table 4.

A 85 minute cycle time was used to plate the test panel having a thickness of 0.24 mm and 0.1 mm through-holes therein and in which the through-holes were drilled using mechanical means.

The current density was 2.8 A/dm$^2$ and plating was performed for 85 minutes.

Figure 6:
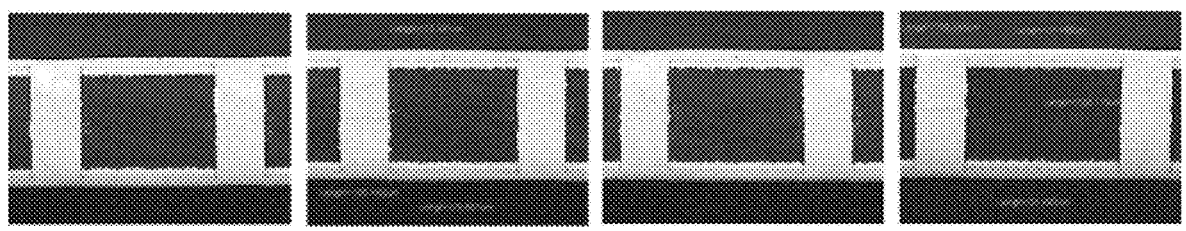
FIG. 6 depicts a cross-sectional view of through-holes of a plated test panel in accordance with Example 3.

FIG. 6 depicts a cross-section of the plated circuit board and shows a plating deposit of 23-25 microns and no dimple.

Comparative Example 3

The acid copper plating bath described above was used to plate a test panel using a standard DC filling process.

A 50 minute cycle time was used to plate the test panel having a thickness of 0.075 mm and 0.1 mm through-holes therein and in which the through-holes were formed using laser drilling.

The current density was 2.8 A/dm$^2$ and plating was performed for 50 minutes.

Figure 7:
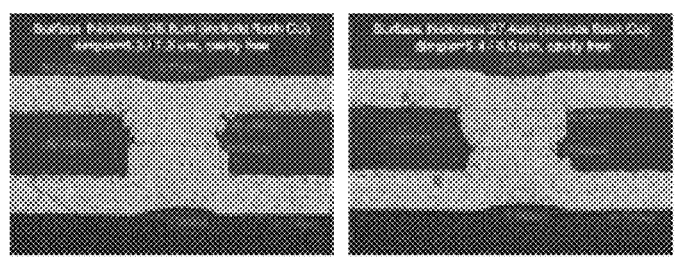
FIG. 7 depicts a cross-sectional view of through-holes of a plated test panel in accordance with Comparative Example 3.

FIG. 7 depicts a cross-section of the plated circuit board and shows a plating deposit of 25-27 microns and exhibiting a dimple of 6-8 microns.

Example 4

The acid copper plating bath described above was used to plate a test panel using a plating cycle in accordance with the present invention and the plating parameter outlined in Table 4.

A 38 minute cycle time was used to plate the test panel having a thickness of 0.075 mm and 0.1 mm through-holes therein and in which the through-holes were formed using laser drilling.

The current density was 2.5 A/dm$^2$ and plating was performed for 38 minutes.

Figure 8:
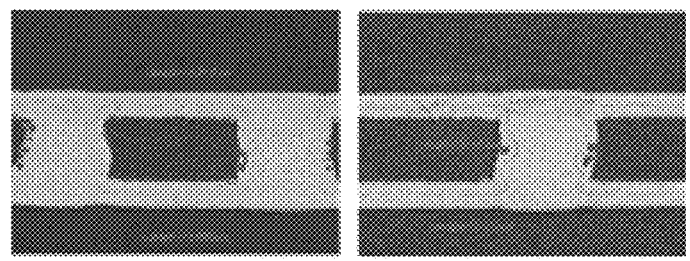
FIG. 8 depicts a cross-sectional view of through-holes of a plated test panel in accordance with Example 4.

FIG. 8 depicts as SEM of the plated circuit board and shows a plating deposit of 10-12 microns and no dimple.

Example 5

A test panel was prepared to evaluate through-hole fill plating.

The test panel had a thickness of 74 μm and through-hole openings with diameters of 50, 75, and 100 μm.

The acid copper plating bath was made up according to the following parameters:

| Ingredient | Make Up |
| --- | --- |
| Copper sulfate | 220 g/L |
| Sulfuric acid | 80 g/L |
| Chloride ions | 60 ppm |
| Brightener | 7 ppm |
| Wetter | 5 g/L |
| Leveler | 0.6 ppm |
| Bath Temperature | 22-23° C. |

The test panel was first cleaned. The cleaning/conditioning solution comprises a 5% v/v solution of AKTIPUR AS (available from MacDermid Enthone) and the test panel was contacted with the cleaning/conditioning solution for approximately 3 minutes at room temperature (i.e., 25° C.). the test panel was contacted with the cleaning/conditioning solution by immersing the test panel in the solution.

Thereafter, the test panel was contacted with an acid treatment solution comprising 3% v/v sulfuric acid for 1 minute at room temperature. The test panel was contacted with the acid treatment solution by immersing the test panel in the solution.

The test panel was rinsed with water after contact with both the cleaning/conditioning solution and the acid treatment solution.

Next, the test panel was contacted with the acid copper plating solution by immersing the test panel in the acid copper plating solution. Electrolytic plating was undertaken at a current density of 22 ASF for a period of 60 minutes. The plating conditions were as outlined in Table 4.

Figure 9:
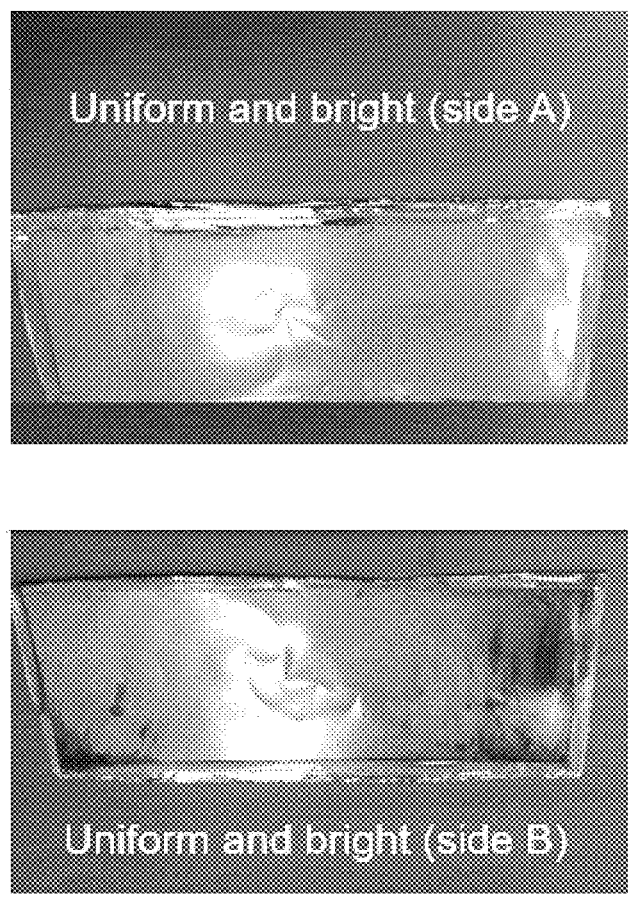
FIG. 9 depicts a photograph showing the plating appearance of a first side and a second side of a plated test panel in accordance with Example 5.

FIG. 9 depicts the plating appearance after through-hole fill plating. As depicted in FIG. 9, the test panel exhibited a uniform and bright copper plating on both sides of the test panel.

Figure 10:
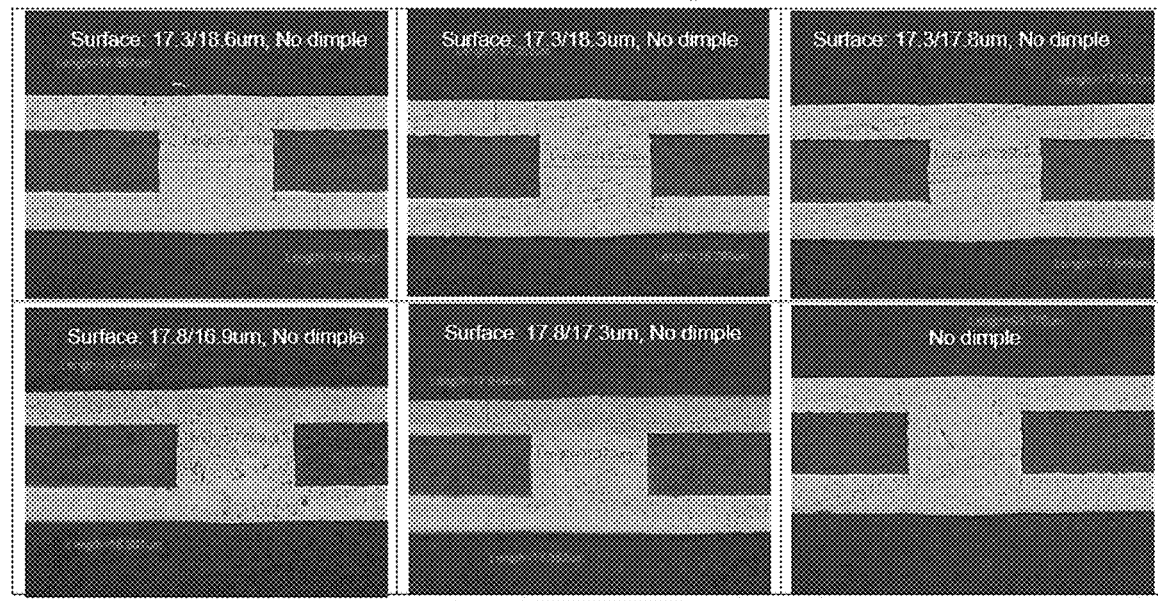
FIG. 10 depicts cross-sections of through-hole fill plating in accordance with Example 5.

FIG. 10 depicts cross-sections of the through-hole fill plating in 100 μm openings taken at various points on the test panel.

As exhibited in FIG. 10, both surfaces of the test panel exhibited uniform plating at a thickness of 17-18 μm and no dimpling of the through-hole filled vias was observed and plating was cavity-free.

Example 6

A test panel was prepared to evaluate through-hole fill plating.

The test panel was prepared with an electroless copper layer and a flash copper layer. The test panel was 460×610 mm and had a thickness of 250 μm. The through-holes had a diameter of 100 μm.

The acid copper plating bath was made up according to the following parameters:

| Ingredient | Make Up |
| --- | --- |
| Copper sulfate | 220 g/L |
| Sulfuric acid | 80 g/L |
| Chloride ions | 60 ppm |
| Brightener | 7 ppm |
| Wetter | 5 g/L |
| Leveler | 0.6 ppm |
| Bath Temperature | 22-23° C. |

The test panel was first cleaned. The cleaning/conditioning solution comprises a 5% v/v solution of AKTIPUR AS (available from MacDermid Enthone) and the test panel was contacted with the cleaning/conditioning solution for approximately 3 minutes at room temperature (i.e., 25° C.). the test panel was contacted with the cleaning/conditioning solution by immersing the test panel in the solution.

Thereafter, the test panel was contacted first with a microetch solution and then with an acid treatment solution. The microetch solution comprised 60 g/L of SPS and 4% v/v sulfuric acid and the contacting time was approximately 1 minute at room temperature. The acid treatment solution contained 3% v/v sulfuric acid for 1 minute at room temperature. The test panel was contacted with the acid treatment solution by immersing the test panel in the solution.

The test panel was rinsed with water after contact with both the cleaning/conditioning solution and the microetch solution.

Next, the test panel was contacted with the acid copper plating solution by immersing the test panel in the acid copper plating solution. Electrolytic plating was undertaken at a current density of 22 ASF for a period of 85 minutes. The plating conditions were as outlined in Table 4.

Figure 11:
FIG. 11 depict photographs showing the plating appearance of a first side and a second side of a plated test panel in accordance with Example 6.

FIG. 11 depicts the plating appearance after through-hole fill plating. As depicted in FIG. 11, the test panel exhibited a uniform and bright copper plating on both sides of the test panel.

Figure 12:
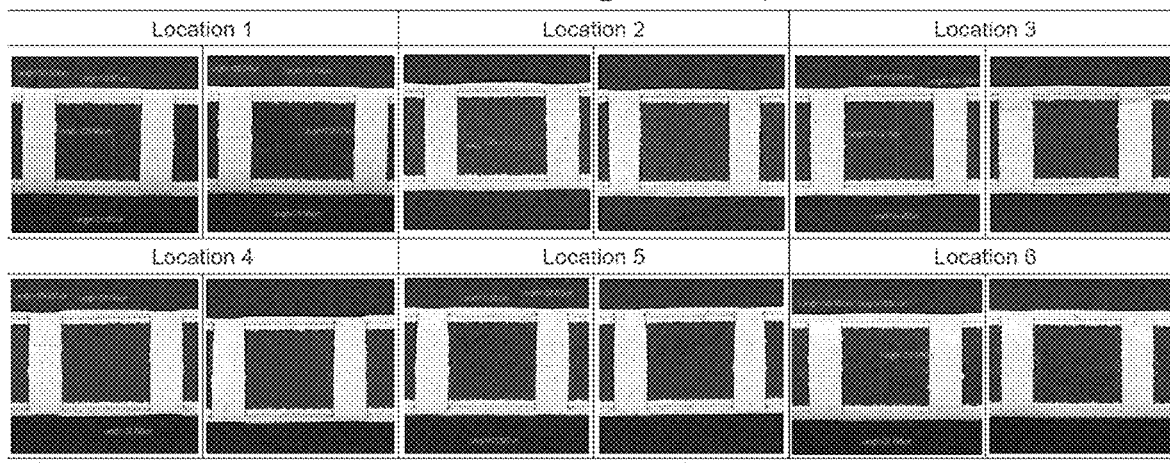
FIG. 12 depicts cross-sections of through-hole fill plating in accordance with Example 6.

FIG. 12 depicts cross-sections of the through-hole fill plating in 100 μm openings taken at various points on the test panel.

As exhibited in FIG. 12, both surfaces of the test panel exhibited uniform plating at a thickness of 22-24 μm and any dimples had a thickness of less than 5 μm. Plating was cavity-free.

Example 7

A test panel was prepared to evaluate X-via filling plating by through-hole fill plating.

The test panel was prepared with an electroless copper layer and a flash copper layer having a thickness of 0.02 to 0.3 mil. The test panel had dimensions of 510×610 mm and a thickness of 2.4 to 3 mil. The hole openings were 2.5 and 2.8 mil.

The acid copper plating bath was made up according to the following parameters:

| Ingredient | Make Up |
|---|---|
| Copper sulfate | 220 g/L |
| Sulfuric acid | 80 g/L |
| Chloride ions | 60 ppm |
| Brightener | 7 ppm |
| Wetter | 5 g/L |
| Leveler | 0.6 ppm |
| Bath Temperature | 22-23° C. |

The test panel was first cleaned. The cleaning/conditioning solution comprises a 5% v/v solution of AKTIPUR AS (available from MacDermid Enthone) and the test panel was contacted with the cleaning/conditioning solution for approximately 3 minutes at room temperature (i.e., 25° C.). the test panel was contacted with the cleaning/conditioning solution by immersing the test panel in the solution.

Thereafter, the test panel was contacted first with a microetch solution and then with an acid treatment solution. The microetch solution comprised 60 g/L of SPS and 4% v/v sulfuric acid and the contacting time was approximately 1 minute at room temperature. The acid treatment solution contained 3% v/v sulfuric acid for 1 minute at room temperature. The test panel was contacted with the acid treatment solution by immersing the test panel in the solution.

The test panel was rinsed with water after contact with both the cleaning/conditioning solution and the microetch solution.

Next, the test panel was contacted with the acid copper plating solution by immersing the test panel in the acid copper plating solution. Electrolytic plating was undertaken at a current density of 21 ASF for a period of 37 minutes. The plating conditions were as outlined in Table 4.

Figure 13:
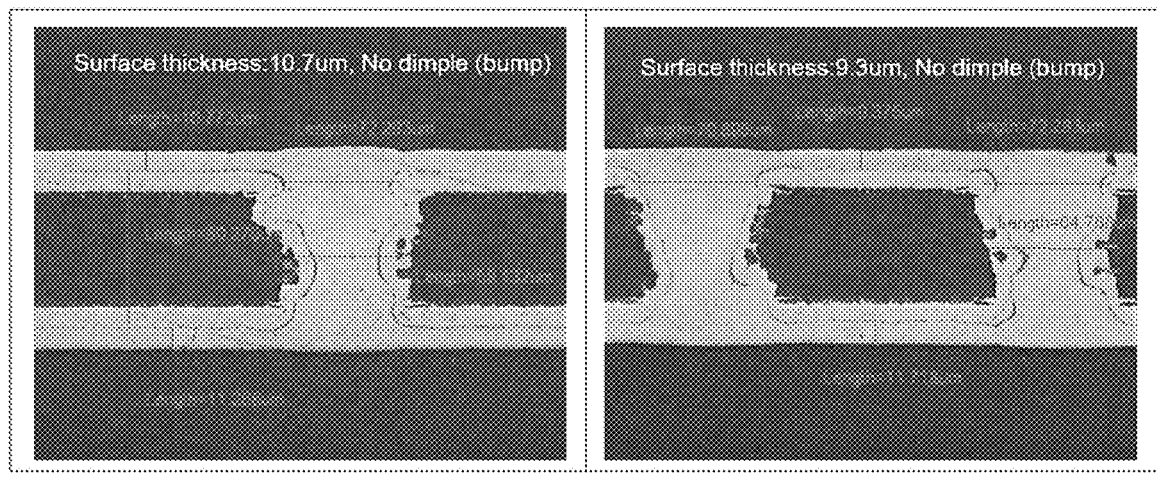
FIG. 13 depicts cross-sections of through-hole openings in accordance with Example 7.

FIG. 13 depicts a cross-section of the hole openings having 2.4 to 2.5 mil opening and 2.0 to 2.2 mil neck. As seen in the figures, the test panel exhibited a uniform and bright copper plating of 9.3 to 10.7 µm on both sides of the test panel and no dimples or voids were observed in the through-hole fill plating.

Figure 14:
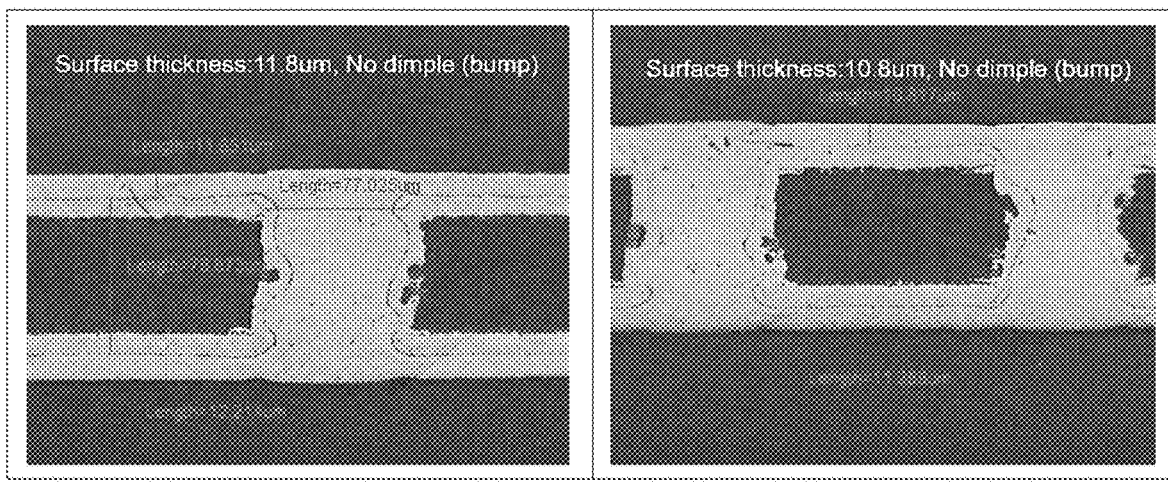
FIG. 14 also depicts cross-sections of through-hole openings in accordance with Example 7.

FIG. 14 depicts a cross-section of the hole openings having 2.8 mil openings and 2.5 to 2.8 mil neck. As seen in the figures, the test panel exhibited a uniform and bright copper plating of 10.8 to 11.8 µm on both sides of the test panel and no dimples or voids were observed in the through-hole fill plating.

Thus it can be seen that the invention described herein allows for the complete filling of through-holes in a single-step in a single copper plating bath, shortening the number of tanks in a line and thus equipment costs, and reducing the number of tanks to maintain, and the number of rectifiers needed for plating. In addition, the process of the present invention also eliminates potential separation issues between via fill plating and bridge plating offered in other processes. Finally, the process of the present invention allows for metallization of through-holes and/or micro-vias that do not exhibit any defects, such as unacceptable voids, cavities, or excessive dimples.

Finally, it should also be understood that the following claims are intended to cover all of the generic and specific features of the invention described herein and all statements of the scope of the invention that as a matter of language might fall there between.

What is claimed is:

1. A method of copper electroplating in the manufacture of printed circuit boards, the method comprising the steps of:
   a) preparing an electronic substrate to receive copper electroplating thereon, wherein the electronic substrate comprises one or more features, wherein the one or more features comprise one of one or more through-holes in the electronic substrate; and
   b) electroplating copper in the one or more features by contacting the electronic substrate with an acid copper electroplating solution comprising:
      a. a source of copper ions;
      b. sulfuric acid;
      c. a source of chloride ions;
      d. a brightener;
      e. a wetter or suppressor; and
      f. a leveler;
         wherein the acid copper electroplating solution is configured for a single-step process, wherein the same acid copper electroplating solution plates the one or more through-holes using a plating cycle until metallization is complete;
         wherein the plating cycle comprises the steps of:
            i) pulse plating for a first time period using a pulse plating cycle to accelerate copper plating in the middle of the through-holes while minimizing an amount of surface copper plated and, thereafter
            ii) direct current plating using uninterrupted forward current in the same copper electroplating solution for a second time period after the step of pulse plating for the first time period;
         wherein the pulse plating for the first time period is performed until the middle of the through-holes begin to close and create a copper bridge in the middle of the through holes and then the step of direct current plating using uninterrupted forward current is performed for the second time period to plate the one or more through holes until the one or more through holes are completely metallized.

2. The method according to claim 1. wherein the step of preparing the printed circuit board to accept electroplating thereon comprises the step of cleaning the printed circuit board prior to metallizing the one or more through-holes.

3. The method according to claim 2, further comprising the step of microetching the cleaned printed circuit board.

4. The method according to claim 1, wherein the one or more metallized through-holes do not exhibit any defects.

5. The method according to claim 4, wherein the electroplated copper deposit completely fills the one or more through-holes and deposits a conformal copper deposit on the electronic substrate.

6. The method according to claim 5, wherein the conformal deposit has a thickness of between about 5 and about 100 µm.

7. The method according to claim 1, wherein the electronic substrate has a thickness of between about 0.05 and about 3 mm.

8. The method according to claim 7, wherein the one or more through-holes have a diameter of about 0.01 and about 1 mm.

9. The method according to claim 8, wherein the one or more through-holes have a diameter of about 0.075 to about 0.25 mm.

10. The method according to claim 7, wherein the one or more through-holes have an aspect ratio of between about 0.5:1 and about 6:1.

11. The method according to claim 1, wherein the acid copper electroplating bath is maintained at a temperature of between about 10 and about 50° C.

12. The method according to claim 1, wherein the acid copper electroplating bath comprises:
a) 100-300 g/L copper sulfate
b) 10-150 g/L sulfuric acid;
c) 20-200 ppm chloride ions;
d) 0.1-30 ppm brightener;
e) 0.1-50 g/L wetter or suppressor; and
f) 0.001-200 ppm leveler.

13. The method according to claim 1, further comprising the step of direct current plating using uninterrupted forward current for a time period prior to the step of pulse plating for the first time period.

14. The method according to claim 13, wherein direct current plating for the time period prior to the step of pulse plating for the first time period deposits a flash copper layer on the surfaces of the one or through-holes.

15. The method according to claim 1, wherein the electronic substrate is contacted with the acid copper electroplating solution by a method selected from the group consisting of spraying, wiping, dipping, and immersing.

16. The method according to claim 15, wherein the electronic substrate is contacted with the acid copper electroplating solution by immersing the electronic substrate in the acid copper plating bath.

17. The method according to claim 1, wherein the pulse plating cycle comprises a first pulse plating cycle with a first pulse plating waveform on a first side of the electronic substrate and a second pulse plating cycle with a second pulse plating waveform on a second side of the electronic substrate.

18. The method according to claim 17, wherein the first pulse plating waveform and the second pulse plating waveform exhibit a phase shift.

19. The method according to claim 17, wherein the first pulse plating cycle and the second pulse plating cycle each comprise a repeating series of one or more forward current pulses, one or more reverse current pulses, and one or more rest periods.

20. The method according to claim 19, wherein the duration of the one or more reverse current pulses is in a range of 100 to 150 ms.

21. The method according to claim 19, wherein the duration of the one or more forward current pulses is in a range of 120 to 150 ms and the duration of the one or more reverse current pulses is in a range of 120 to 150 ms and the duration of the one or more forward current pulses is substantially the same as the duration of the one or more reverse current pulses.

22. The method according to claim 1, wherein the through-holes have an aspect ratio of between 0.5:1 and 6:1.

23. A method of copper electroplating in the manufacture of printed circuit boards, the method comprising the steps of:
a) providing an electronic substrate, wherein the electronic substrate comprises one or more features, wherein the one or more features comprise one or more through-holes in the electronic substrate; and
b) electroplating copper in the one or more features by contacting the electronic substrate with an acid copper electroplating solution comprising:
a. 100-300 g/L of a source of copper ions;
b. 10-50 g/L of an acid;
c. 20 to 200 ppm of a source of chloride ions;
d. 0.1-30 ppm of a brightener, wherein said brightener is selected from the group consisting of 3-(benzothiazolyl-2-thio)-propyl sulfonic acid, sodium salt; 3-mercaptopropane-1-sulfonic acid, sodium salt; ethylene dithiodipropyl sulfonic acid, sodium salt; bis-(p-sulfophenyl)-disulfide, disodium salt; bis-(ω-sulfobutyl)-disulfide, disodium salt; bis-(ω-sulfohydroxypropyl)-disulfide, disodium salt; bis-(ω-sulfopropyl)-disulfide, disodium salt; bis-(ω-sulfopropyl)-sulfide, disodium salt; methyl-(ω-sulfopropyl)-disulfide, disodium salt; methyl-(ω-sulfopropyl)-trisulfide, disodium salt; O-ethyldithiocarbonic acid-S-(ω-sulfopropyl)-ester, potassium salt; thioglycolic acid; thiophosphoric acid-O-ethyl-bis-(ω-sulfopropyl)-ester, disodium salt; and thiophosphoric acid-(ω-sulfopropyl)-ester, trisodium salt;
e. 0.1-50 g/L of a wetter or suppressor selected from the group consisting of carboxymethylcellulose, nonylphenolpolyglycolether, octandiol-bis-(polyalkylene glycol ether), octanol polyalkylene glycol ether, oleic acid polyglycol ester, polyethylene glycol polypropylene glycol copolymerisate, polyethylene glycol, polyethylene glycol dimethylether, polypropylene glycol, polyvinylalcohol, β-naphthyl polyglycol ether, stearic acid polyglycol ester, stearic acid alcohol polyglycolether, and copolymers of propylene glycol and ethylene glycol; and
f. 0.001-200 ppm of a leveler selected from the group consisting of polyamines, ethoxylated polyamines, polypyridine, polyimidazole, polyvinyl pyridine, polyvinyl imidazole, ethoxylated polyvinyl pyridine, and ethoxylated polyvinyl imidazole;
wherein the acid copper electroplating solution is configured for a single-step process, wherein the same acid copper electroplating solution plates the one or more features until metallization is complete; and
wherein the single-step acid copper electroplating process comprises a plating cycle comprising, in order;
a) pulse plating for a first time period using a pulse plating cycle to accelerate copper plating in the middle of the through-holes while minimizing an amount of surface copper plated and, thereafter
b) direct current plating using uninterrupted forward current in the same acid copper electroplating solution for a second time period after the step of pulse plating for the first time period;
wherein the pulse plating for the first time period is performed until the middle of the through-holes begin to close and create a copper bridge in the middle of the through holes and then the step of direct current plating using uninterrupted forward current is performed for the second time period to plate the one or more through boles until the one or more through holes are completely metallized.

* * * * *